United States Patent [19]

Albrecht et al.

[11] 4,137,459
[45] Jan. 30, 1979

[54] METHOD AND APPARATUS FOR APPLYING FOCUS CORRECTION IN E-BEAM SYSTEM

[75] Inventors: Drew E. Albrecht, Flanders, N.J.; Samuel K. Doran, Putnam Valley, N.Y.; Michel S. Michail, Wappingers Falls, N.Y.; Hannon S. Yourke, Poughkeepsie, N.Y.

[73] Assignee: International Business Machines Corporation, Armonk, N.Y.

[21] Appl. No.: 877,198

[22] Filed: Feb. 13, 1978

[51] Int. Cl.² ............................................. A61K 27/02
[52] U.S. Cl. ........................ 250/492 A; 250/396 ML
[58] Field of Search ........................... 250/492 A, 396

[56] References Cited

U.S. PATENT DOCUMENTS 3,900,736  8/1975  Michail ........................... 250/492 A Primary Examiner—Harold A. Dixon
Attorney, Agent, or Firm—James M. Thomson

[57] ABSTRACT

A method and apparatus for applying focus correction to an E-beam or charged particle system to compensate for wafer warp and mask tilt. In an electron beam system including a registration system which measures the position of four registration marks with the beam and calculates the apparent magnification error of a given chip, means are also provided for using magnification and rotation error information to calculate a height error factor and to apply a compensating current to a dynamic focusing coil of the electron beam to move the effective beam focal plane to a position which matches the wafer or mask plane at each chip site.

3 Claims, 6 Drawing Figures

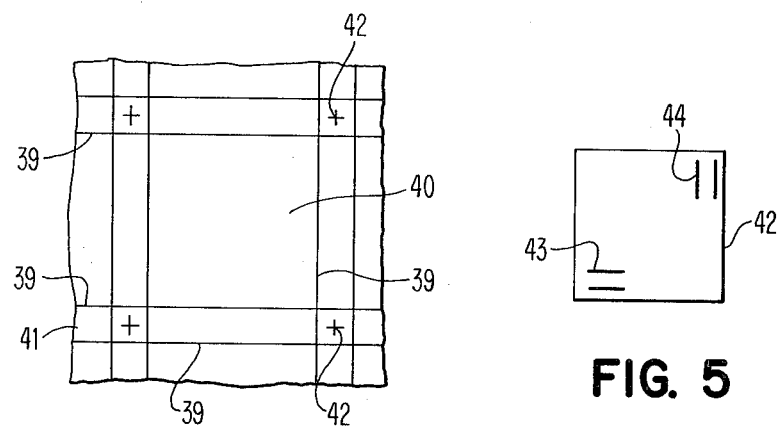
FIG. 4
FIG. 5
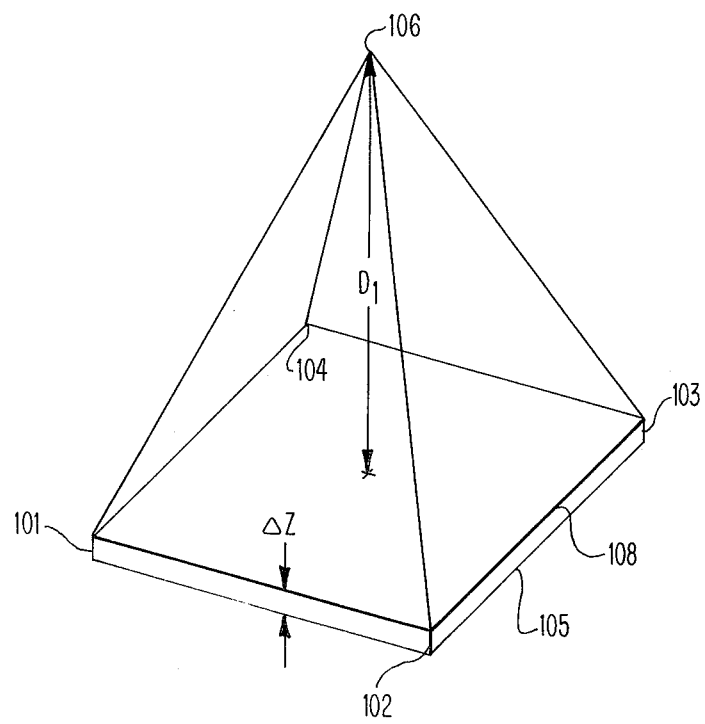
FIG. 6

METHOD AND APPARATUS FOR APPLYING FOCUS CORRECTION IN E-BEAM SYSTEM

BACKGROUND OF THE INVENTION

In U.S. Pat. No. 3,644,700 to Kruppa et al., there is shown a method and apparatus for controlling a square-shaped beam. The beam is employed to both write desired patterns on chips of a semiconductor wafer or mask and to locate each chip relative to a predetermined position through determining the positions of a pair of registration marks for each chip by utilization of the beam. In the aforesaid Kruppa et al. patent, the location of the two registration marks insures that the pattern can be written within the chip.

Because of the accuracy required in applying the beam to a field, the size of each chip site must be limited to that of the writing field so that any beam error therein is within a certain range. Accordingly, the size of the writing fields cannot be enlarged to enable a single pattern to be written within a single writing field, which defines the maximum size of a chip site in the aforesaid Kruppa et al. patent, when the pattern size exceeds the maximum field size within which the beam can be written and still have the beam error within the desired range.

U.S. Pat. No. 3,900,736 to Michail et al., is an improvement of the method and apparatus of the aforesaid Kruppa et al. patent in that it discloses means whereby a single pattern can be written in more than one writing field rather than being limited to one writing field. Thus, the method and apparatus of Michail et al. permit a semiconductor wafer to have continuous patterns larger than the field to which the beam can be applied accurately to be written therein. Michail et al. accomplish this through utilizing a plurality of square or rectangular shaped fields with each field overlying each of the adjacent fields. Thus, each field which is not on the periphery of the wafer, has an overlying relation with four other adjacent fields. In each of the four corners of the field, a registration mark is disposed in the overlying area of the adjacent fields.

While it is desired that each of these registration marks be at a design position so that the registration marks would define a four sided rectangular or square shaped field having the registration marks at their corners, there is usually some slight deviation of each of the marks from its design position since the registration marks are written on the wafer within a certain tolerance. Therefore, the registration marks are normally not at their design positions but at some deviation therefrom. By ascertaining the deviation of each of the four registration marks for a particular field from the design locations for the registration marks, the boundaries of the writing field are located.

Since the beam is being applied in accordance with a predetermined pattern in which the field was deemed to be a perfect square or rectangle, these deviations of the registration marks for the particular field result in the field not being a perfect square or rectangle. Therefore, if the beam were to be applied in accordance with the predetermined pattern, the beam may be applied beyond the boundaries defined by the registration marks and into another field if correction is not made.

While the patterns for writing within a specific field would be such as to insure that the beam is not applied beyond the field even with the deviations of the marks, this cannot be relied upon when writing a single pattern in more than one field. This is because the beam must be applied to each field separately because of the required accuracy of the beam with respect to field size. Thus, each line written by the beam must stop at a specific boundary so that when the beam is applied to the next adjacent field it will be applied as a continuation of the prior location of the beam at the boundary between the two adjacent fields.

Accordingly, to insure that the beam is applied within the boundaries of the field as defined by the actual locations of the registration marks relative to the beam, it is necessary to dynamically correct the position of the beam when it is stepped from one predetermined position to the next within the field so that the beam is applied to an actual position, which is a deviation from the predetermined position, in accordance with the actual site of the field as defined by the four registration marks of the field. By this dynamic correction at each of the predetermined positions, the beam writes the pattern within the field boundaries as defined by the actual locations of the registration marks.

When the fields are written by moving the beam from one field to the next adjacent field in the X direction and to the right, the registration marks in the upper and lower right hand corners of the first field will be the registration marks in the upper and lower left hand corners for the next field. Therefore, these two registration marks define the common boundary between the two fields and function as reference points to which the beam is applied at the next of the adjacent fields. The other boundaries of the field are similarly defined with respect to the registration marks of the other adjacent fields.

It should be understood that reference points could be ascertained relative to the actual locations of the registration marks and used to define the boundaries of the field rather than the registration marks per se. This shift would be accomplished within the computer, but it would not have any effect on the concept of the pattern being written within the field as defined by the four registration marks at the corners of the field.

Through ascertaining the actual location of each of the registration marks of a field, various digital constants can be determined and applied throughout writing of the pattern within the particular field. The digital constants are utilized to correct for translation, magnification, rotation, and distortion of the beam in the X and Y directions. By using the magnetic deflection voltages for each of the X and Y directions at each of the predetermined positions to which the beam is to be applied and then modifying these voltages by the appropriate digital constants for the particular field, correction voltages are applied for both the X and Y directions to a set of electrostatic field plates to shift the beam from the predetermined position to the actual deviated position in accordance with the actual field as defined by the actual location of the registration marks.

As a result of applying the correction voltage to shift the beam, the beam is written within the boundaries of the field since the beam would either be compressed or extended, for example, in each line to compensate for the difference between the predetermined position and the actual position.

The method and apparatus of Michail et al. are particularly useful when it is desired to write a plurality of patterns at different levels of a chip with each level being written at a different time. This enables overlay accuracy between the written fields at various levels on a chip.

This is accomplished through ascertaining the actual location of each of the four registration marks of a field, as previously mentioned, and retaining these actual locations for reference throughout the various levels of pattern writing. If it should be necessary to use a new set of registration marks, these would be written with their actual locations determined with respect to the actual locations of the prior registration marks, which define the field. Thus, by using the digital constants to correct the translation, magnification, rotation, and distortion of the beam in the X and Y directions, the beam can always be shifted from its predetermined position to its actual deviated position irrespective of the level at which the pattern is being written to insure that the pattern at each level has an accurate overlay with the patterns at other levels of the field.

The aforementioned Kruppa et al. and Michail et al. patents describe apparatus which functions successfully to achieve writing in multiple overlay or chip sites where the silicon wafers being written upon are relatively flat. However, silicon wafers tend to warp during hot processing steps utilized in other stages of semiconductor production. Accordingly, the silicon wafers which typically are to be processed through electron beam systems and written upon at multiple chip sites tend to have considerable warp. Said warp causes a given wafer surface to move out of the electron beam focal plane. This, in turn, causes inaccuracies which are not compensated for in either of the Kruppa et al. or Michail et al. systems.

In addition, mask tilt due to handling is another problem which occurs in writing masks with an electron beam system. This problem has not been dealt with in any of the previously described systems.

Accordingly, it is an object of the invention to provide means in context of a system such as that described by Kruppa et al. and Michail et al. to correct the electron beam focus to match a given semiconductor wafer surface at each chip site. Moreover, it is an object of the invention to provide a technique for correcting for mask tilt.

SUMMARY OF THE INVENTION

The present invention describes a method and apparatus adapted for use in conjunction with electron beam apparatus such as that described in the aforementioned Kruppa et al. and Michail et al. patents wherein an electron beam or beam of charged particle, is scanned over multiple chip sites and wherein magnification corrections are made with respect to the beam for a given chip site. Such a system involving a registration system wherein the electron beam is utilized to measure the position of four registration marks and calculate the apparent magnification of each chip. According to the present invention the apparent magnification error is also used to calculate a height error signal as will be explained hereinafter. The dynamic focus coil current of the beam column is then corrected by a value which is proportional to the height error signal in order to move the beam focal plane sufficiently to match the wafer plane at a given chip site.

BRIEF DESCRIPTION OF THE DRAWINGS

FIG. 4 is a top plan view of a portion of a semiconductor wafer having fields to which the beam is to be applied and showing the relation of the overlapping fields.

FIG. 5 is an enlarged top plan view of a registration mark that identifies one corner of a field within which an electron beam can write.

FIG. 6 is a view of a beam set up with respect to a chip site which illustrates the presence of a height error factor occurring with respect to a nominal target plane as opposed to a natural target plane.

DETAILED DESCRIPTION OF THE INVENTION

Figure 1:
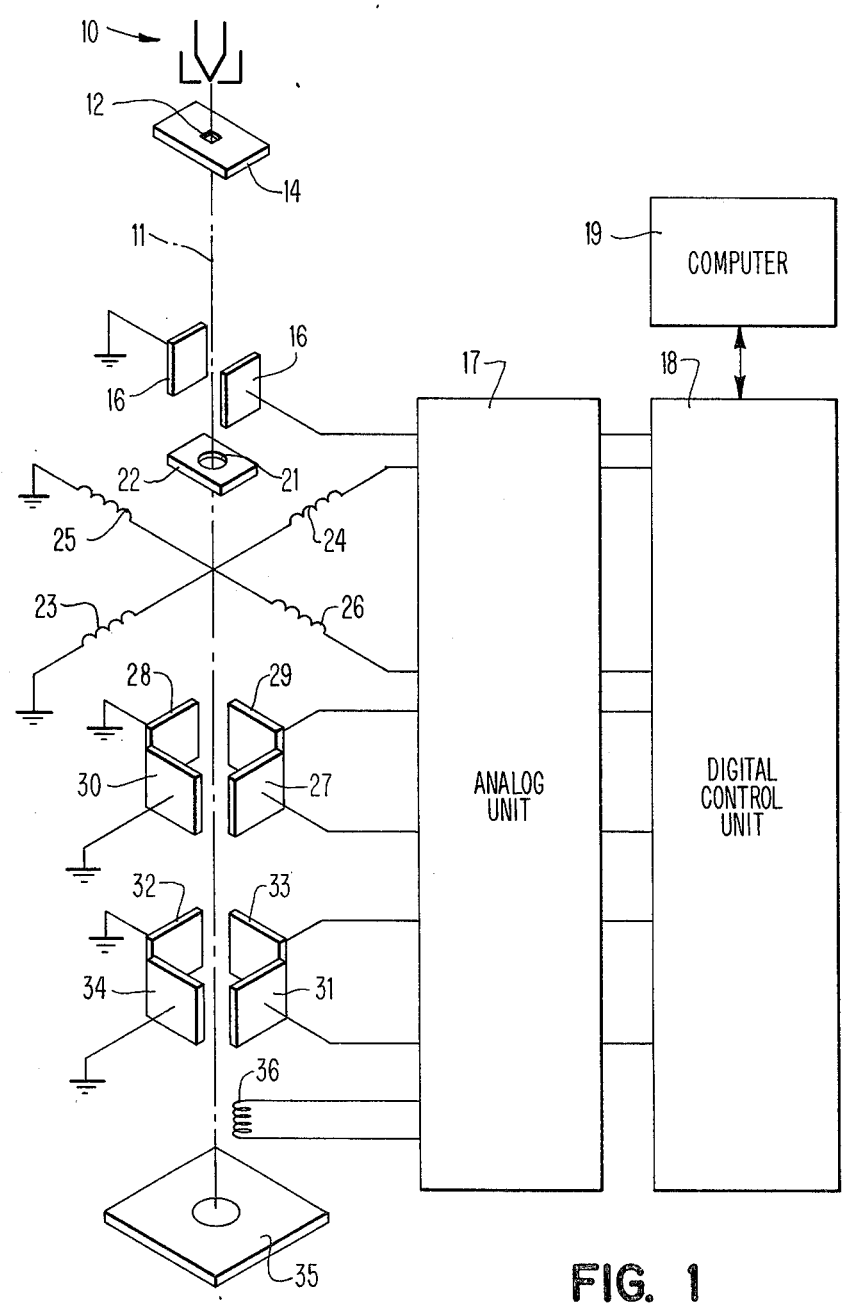
FIG. 1 is a schematic view showing an electron beam and the apparatus for controlling the beam.

Referring to the drawings and particularly FIG. 1, there is shown an electron gun 10 for producing a beam 11 of charged particles in the well-known manner. The electron beam 11 is passed through an aperture 12 in a plate 14 to shape the beam 11. The beam 11 is preferably square shaped and has a size equal to the minimum line width of the pattern that is to be formed. Alternatively the beam can have a rectangular, variable shaped cross-section.

The beam 11 passes between a pair of blanking plates 16, which determine when the beam 11 is applied to the material and when the beam 11 is blanked. The blanking plates 16 are controlled by circuits of an analog unit 17. The analog unit 17 is controlled by a digital control unit 18 in the manner more particularly shown and described in U.S. Pat. No. 3,866,013 entitled "Method and Apparatus For Controlling Movable Means Such As An Electron Beam" by Philip M. Ryan issued on Feb. 11, 1975 and assigned to the same assignee as the assignee of this application. The digital control unit 18 is connected to a computer 19, which is preferably an IBM 370 computer.

The beam 11 then passes through a circular aperture 21 in a plate 22. This controls the beam 11 so that only the charged particles passing through the centers of the lenses (not shown) are used so that a square-shaped spot without any distortion is produced.

The beam 11 is next directed through magnetic deflection coils 23, 24, 25 and 26. The magnetic deflection coils 23 and 24 control the deflection of the beam 11 in a horizontal or X direction while the magnetic deflection coils 25 and 26 control the deflection of the beam 11 in a vertical or Y direction. Accordingly, the coils 23-26 cooperate to move the beam 11 in a horizontal scan by appropriately deflecting the beam 11.

While the beam 11 could be moved in a substantially raster fashion as shown and described in the aforesaid Kruppa et al. patent, it is preferably moved in a back and forth scan so that the beam 11 moves in opposite directions along adjacent lines as shown and described in the aforesaid Ryan application. Thus, the negative bucking sawtooth of the type shown in FIG. 3B of the aforesaid Kruppa et al. patent is supplied to the coils 23 and 24 during forward scan while a positive bucking sawtooth, which is of opposite polarity to the sawtooth shown in FIG. 3B of the aforesaid Kruppa et al. patent, is supplied to the coils 23 and 24 during the backward scan.

The beam 11 then passes between a first set of electrostatic deflection plates 27, 28, 29 and 30. The electrostatic deflection plates 27 and 28 cooperate to deflect the beam in a horizontal or "X" direction while the electrostatic deflection plates 29 and 30 cooperate to move the beam 11 in the vertical or Y direction. The plates 27-30 are employed to provide any desired offset of the beam 11 at each of the predetermined positions or spots to which it is moved.

After passing between the electrostatic deflection plates 27-30, the beam 11 then passes between a second set of electrostatic deflection plates 31, 32, 33 and 34. The electrostatic deflection plates 31 and 32 cooperate to deflect the beam 11 in the horizontal or X direction while the electrostatic deflection plates 33 and 34 cooperate to deflect the beam 11 in the vertical or Y direction. The plates 31 and 32 deflect the beam 11 in the X direction and the plates 33 and 34 deflect the beam 11 in the Y direction from each of the predetermined positions to which it is moved in accordance with its predetermined pattern so that the beam 11 is applied to its actual position based on the deviation of the area from its designed position, both shape and location, in which the beam 11 is to write.

After passing between deflection plates 31-34 the beam passes through a focusing coil 36. Focusing coil 36 is the means provided to receive a height error correction signal to correct the beam focus at a given chip site for wafer warp in a manner described hereinafter. The focusing coil is connected to analog unit 17 and digital control unit 18 in a manner described in detail in connection with FIGS. 1 and 2.

The beam 11 is then applied to a target, which is suported on a table 35. The table 35 is movable in the X and Y directions as more particularly shown and described in the aforesaid Kruppa et al. patent.

The beam 11 is moved through A, B and C cycles as shown and described in the aforesaid Kruppa et al. patent and signals are supplied to shift the beam 11 from each of the predetermined positions to which it is stepped to a deviated actual position, which is determined by the location of an actual field in comparison with the design field, during the B cycle when the pattern is being written.

As shown in FIG. 4, the target may comprise a plurality of fields 39 which overlap each other. A chip 40 may be formed within each of the fields 39 so that there is a plurality of the chips 40 on a semiconductor wafer 41 with each of the chips 40 having resist to be exposed by the beam 11.

It should be understood that the chip 40 may comprise a plurality of the fields 39 or one of the fields 39 may have a plurality of the chips 40. The following description will be with one of the chips 40 formed within each of the fields 39.

There is a registration mark 42 (schematically shown as a cross in FIG. 4) at each of the four corners of each of the fields 39. As shown in FIG. 4, the overlapping of the adjacent fields 39 results in the same registration mark 42 being utilized for each of four different adjacent fields 39. Thus, the registration mark 42 in the lower right corner of the only complete field 39 shown in FIG. 4 also is the registration mark in the lower left corner for the field 39 to the right of the complete field 39, the upper right corner of the field below the complete field 39, and the upper left corner of the field 39 which is diagonally to the right of the completed field 39.

Each of the registration marks 42 is preferably formed of a plurality of horizontally extending bars 43, preferably two in number as shown in FIG. 5, and a plurality of vertically extending bars 44, preferably equal in number to the number of the bars 43. Any other suitable arrangement of registration marks can be employed in which there can be a scan of the vertical edges of the mark in the X direction and of horizontal edges of the mark in the Y direction.

The overlapping of the fields 39 enables writing to occur between the adjacent fields. The boundary of each of the chips 40 is within the overlapping area of the field 39 of the chip 40 and is normally defined by the lines extending between the registration marks 42.

The exact location of each of the registration marks 42 is obtained through passing the electron beam 11 over the vertical edges of the vertically disposed bars 44 of the mark 42 during scans in the X direction and over the horizontal edges of the horizontally disposed bars 43 of the mark 42 during scans in the Y direction.

Figure 3:
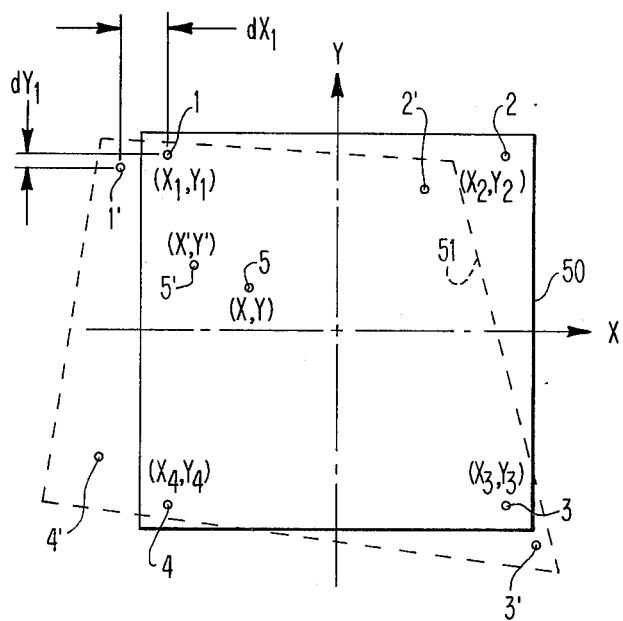
FIG. 3 is a schematic diagram showing the relation between an actual field to which the beam is to be applied in conjunction with the field to which the beam would be applied without dynamic correction for the location of the registration marks.

If the registration marks 42 were located at their design positions, then the design field, as defined by the registration marks 42 being located at design positions 1, 2, 3 and 4 in FIG. 3, would exist, and the beam 11 would be applied thereto. The design field 50 would be a perfect square or rectangle.

However, because of various factors such as the condition of the surface of the wafer 41, the material of the wafer 41 at the particular level, the tilt of the wafer 41, rotational error due to location of the wafer 41, positional errors of the beam 11, and the errors in putting down the registration marks 42, the registration marks 42 are not located at the design positions 1, 2, 3 and 4 as shown in FIG. 3. Instead, because of these various factors, the registration marks 42 are located at positions such as positions 1', 2', 3' and 4', for example, as shown in FIG. 3. As a result, an actual field 51, which is not necessarily a perfect square or rectangle but is four sided, in which the beam 11 can write is produced by the registration marks 42 being at the positions 1', 2', 3' and 4' rather than the design positions 1, 2, 3, and 4.

If it is desired to write the pattern in both the chip 40 within the field 51 and the chip 40 within the field to the right of the field 51, for example, then the line between the positions 2' and 3' must be accurately defined so that the beam 11 will form a continuation of the same lines within the field 51 when writing in the field to the right of the field 51. The line defined between the positions 2' and 3' is the boundary between the chip 40 within the field 51 and the chip 40 within the field to the right of the field 51 so that this is a common boundary between the two chips 40. It should be understood that the area of the chip 40 within which the beam 11 writes need not be the entire field as defined by the positions of the registration marks 42 but can be smaller and use the registration marks 42 as reference points.

The difference between the design and actual positions of each of the registration marks 42 can be defined by setting forth the difference between the design and actual positions of the mark 42 in both the X and Y directions. The equations for any specific mark positions are:

$$dX = A + BX + CY + DXY \quad (1)$$

and $$dY = E + FX + GY + HXY. \tag{2}$$

In equations (1) and (2), X represents the design position of the mark in the X direction and Y represents the design position in the Y direction with dX being the distance between the design position and the actual position in the X direction and dY being the distance between the actual position and the design position in the Y direction. Each of A, B, C, D, E, F, G and H is a digital constant which can be ascertained for the particular field within which the beam 11 is to be applied.

The digital constant A represents the translation of the beam in the X direction while the digital constant E represents the translation of the beam 11 in the Y direction. The digital constant B represents the magnification error in the X direction, and the digital constant G represents the magnification error in the Y direction. The digital constant C represents the rotation error of the beam 11 in the X direction, and the digital constant F represents the rotation error of the beam 11 in the Y direction. The digital constant D represents the distortion of the beam 11 in the X direction, and the digital constant H represents the distortion of the beam 11 in the Y direction.

The Michail et al. patent defines further the mathematical relationships relating to the digital constants and sets forth a mathematical solution for solving for the digital constants.

Thus, the digital constants A, B, C, D, E, F, G, and H are ascertained through using the design locations of the positions 1, 2, 3 and 4 in the X and Y directions, which are known for the design field 50, along with the actual distances, as defined by $dX_1$ to $dX_4$ and $dY_1$ to $dY_4$, between the positions 1, 2, 3 and 4 and the positions 1', 2,', 3' and 4', respectively, in the X and Y directions. Each of the positions of the beam 11 in the field 50 also is defined by the magnetic deflection voltage of the beam 11 at the particular position.

With the magnification error constant defined, reference to FIG. 6 is useful in understanding the compensation technique for focus correction. In FIG. 6 a chip width is illustrated, defined between four registration marks 101, 102, 103 and 104 in a normal wafer plane 105. A beam deflection working distance D1 is defined between the normal plane and a deflection rocking point 106 for the beam. A similar chip width is defined for a warped wafer plane 108 such as might be expected to occur when processing a typical semiconductor wafer.

As is apparent from the figure the deflection angles of the beam to the wafer differ for the planes 105, 108, as do the working dimensions. Moreover, a height error factor $\Delta Z$ is defined in figure which is the physical dimension for which focus must be corrected for the particular chip site under consideration.

Once the height error factor $\Delta Z$ is calculated the dynamic focus coil current can be changed proportional to the $\Delta Z$ factor in order to move the beam focal plane to match the wafer plane at each particular chip site. However, when the focus correction is made in the aforementioned manner it should be apparent that the magnification changes. Thus, the magnification measured at the next chip site will have a component due to the $\Delta Z$ height error factor and the component due to the previously applied focus correction factor.

The $\Delta Z$ correction factor is computed from the magnification coefficients B and G as follows:

Equation 3:

$$M_n = (B + G)/2 \tag{3}$$

where $M_n$ is the average magnification error of the nth chip site measured during registration. The $\Delta Z_n$ correction factor is given by equation 4.

$$\Delta Z_n = K1 (M_n - K_2 dZ_{n-1}) \tag{4}$$

where $\Delta Z_{n-1}$ is the focus correction of the previously compensated chip site and $\Delta Z_0 = 0$. The constants K1 and K2 are dependent upon the effective working distance and the sensitivity of the dynamic focus coil. It has been found that K2 of about 0.2 is fairly typical and a K1 value in the order of 100 millimeters is fairly typical in the system described.

After the digital constants A, B, C, D, E, F, G, and H for the actual field 51 have been solved, the magnetic voltages for X and Y can be substituted in equation (1) for dX and equation (2) for dY to ascertain the deflection voltage that must be applied to the beam 11 when it is at any predetermined position (X, Y) to shift the beam 11 to its corresponding actual position (X', Y'). Thus, dX is the deflection voltage to be applied for the X direction to shift the beam 11 from its predetermined position X to its actual position X', and dY is the deflection voltage to be applied to shift the beam 11 in the Y direction from its predetermined position Y to its actual position Y'.

Accordingly, with the magnetic deflection voltage at each of the predetermined positions to which the beam 11 is stepped during the writing of the pattern being different, the substitution of the X and Y magnetic deflection voltages in equations (1) and (2) enables determination of dX and dY for any position in the writing pattern. This enables the corrections to be correlated to the magnetic deflection voltages.

The voltage, which is obtained by solving equation (1) for dX, is the deflection voltage applied to the electrostatic deflection plates 31 and 32, and the deflection voltage, which is obtained by solving equation (2) for dY, is supplied to the electrostatic deflection plates 33 and 34. Thus, the deflection voltages at each of the predetermined positions causes a shift of the beam 11 to dynamically correct the deflection of the beam 11 at each of the predetermined positions to which it is stepped so that the beam 11 is moved to the actual deviated position whereby the predetermined pattern is written within the actual field 51 rather than the design field 50 for which the pattern was programmed in the computer 19.

Therefore, to write the predetermined pattern within the actual field 51 rather than the design field 50, it is necessary to continuously determine the X and Y magnetic deflection voltages at any position in the field. After determining the appropriate correction voltages (dX and dY) with the X and Y magnetic deflection voltages substituted in equations (1) and (2), the correction voltage (dX) is supplied to the electrostatic deflection plates 31 and 32 for the X direction and the correction voltage dY is supplied to the electrostatic deflection plates 33 and 34 for the Y direction.

At the same time the focus error in $\Delta Z$ or height error factor are both computed using equations 3 and 4 as described hereinbefore and current is applied to focus coil 36 to continuously apply a correction signal to the beam for dynamic focus correction.

To continuously apply the calculated constant value corrections A–H to the beam 11, the circuits described in detail in the aforementioned Michail et al. patent are utilized. In addition, in order to apply the ΔZ height error correction signal the circuit of FIG. 2 is utilized.

Figure 2:
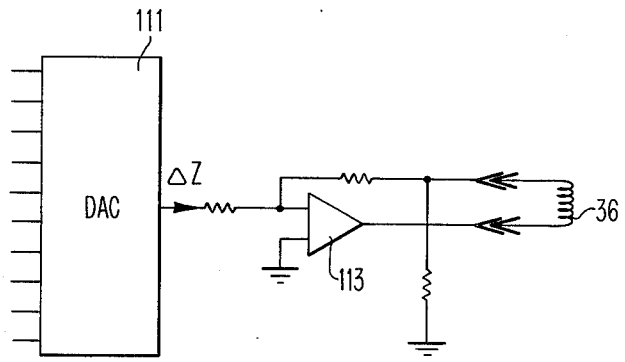
FIG. 2 is a schematic block diagram of a circuit arrangement for dynamically supplying signals to supply focus current correction signals to the dynamic focus coil of the system of FIG. 1.

FIG. 2 illustrates a digital to analog converter 111 adapted to supply its output to one input of a differential amplifier 113. The other input of the differential amplifier is referenced to ground. The output of the differential amplifier is connected to dynamic focus coil 36 as illustrated in FIG. 1.

The digital to analog converter receives inputs from the digital control unit of FIG. 1 and computer 19 in the fashion described in the aforementioned Michail et al. patent. These inputs in effect are the calculated values for B and G which enable derivation of the specific correction factors for magnification error and, therefore, ΔZ height error which are applied to coil 36.

It has been found that the above method and apparatus provides excellent compensation for warped wafers within an electron beam system such as that described in the aforementioned Kruppa et al. and Michail et al. patents. The wafer warp compensation technique is particularly advantageous since traditional wafer flattening techniques utilizing vacuum cannot be used within such electron beam systems where the entire wafer must be in vacuum for pattern writing or exposure.

It should be apparent that the technique described hereinbefore can be utilized as well in fabrication of semiconductor masks where it is desirable to compensate for mask tilt. Thus, the present technique can be followed, using registration marks placed on the mask for stitching, for example, and permits focus correction for error which occurs due to mask tilt.

We claim:

1. In an electron beam system which includes registration means that calculate the apparent magnification and rotation error of a given target chip, the improvement comprising means for utilizing the calculated magnification and rotation error information to calculate a height error factor and means to apply a compensating current proportional to said height error factor to a dynamic focusing coil of the system to move the effective beam focal plane of the system to a position which matches the target plane at each chip site.

2. The system of claim 1 wherein said means for utilizing the calculated magnification and rotation error information comprises a digital to analog converter and said means for applying a compensating circuit includes a differential amplifier adapted to provide an output to said focusing coil.

3. In a method of positioning a beam of charged particles with respect to a target chip wherein a registration means is utilized to calculate the apparent magnification and rotation error of a given chip and apply a correction factor to said beam to relocate the beam from a predetermined position to a modified position which deviates from the predetermined position in proportion to said magnification and rotation error factors, the improvement comprising the steps of utilizing the calculated magnification and rotation error information to further calculate a height error factor and applying a compensated current to the dynamic focusing coil of the system to move the effective beam focal plane to a position which matches the target plane at the given chip site.

* * * * *